(12) United States Patent
Mercer et al.

(10) Patent No.: US 10,591,528 B2
(45) Date of Patent: Mar. 17, 2020

(54) SYSTEM AND METHOD FOR USING A CONNECTOR AT THE END OF A CABLE AS A CABLE LOCATING TONE SENSOR

(71) Applicant: Ideal Industries Network Limited, High Wycombe (GB)

(72) Inventors: Ian Mercer, Stokenchurch (GB); Peter Kent, Stokenchurch (GB)

(73) Assignee: Ideal Industries Network Limited (GB)

( * ) Notice: Subject to any disclaimer, the term of this patent is extended or adjusted under 35 U.S.C. 154(b) by 88 days.

(21) Appl. No.: 15/891,544

(22) Filed: Feb. 8, 2018

(65) Prior Publication Data
US 2019/0049505 A1    Feb. 14, 2019

Related U.S. Application Data

(60) Provisional application No. 62/458,662, filed on Feb. 14, 2017.

(51) Int. Cl.

| | |
|---|---|
| *G01R 19/00* | (2006.01) |
| *G01R 31/02* | (2006.01) |
| *H04M 3/26* | (2006.01) |
| *H04B 3/48* | (2015.01) |
| *H04B 3/46* | (2015.01) |
| *G01R 29/18* | (2006.01) |
| *G01R 25/00* | (2006.01) |

(Continued)

(52) U.S. Cl.
CPC ........... *G01R 31/023* (2013.01); *G01R 25/00* (2013.01); *G01R 29/18* (2013.01); *G01R 31/021* (2013.01); *G01R 31/024* (2013.01); *G01R 31/041* (2013.01); *H04B 3/46* (2013.01); *H04B 3/48* (2013.01); *H04M 3/26* (2013.01); *G01R 31/02* (2013.01); *H04M 3/2209* (2013.01)

(58) Field of Classification Search
CPC .... G01R 31/023; G01R 29/18; G01R 31/021; G01R 31/041; G01R 25/00; G01R 31/02; G01R 31/024
USPC ............................................ 324/66, 67, 326
See application file for complete search history.

(56) References Cited

U.S. PATENT DOCUMENTS

| | | |
|---|---|---|
| 5,457,441 A | 10/1995 | Clement |
| 5,574,769 A | 11/1996 | Clement |
| 5,577,009 A | 11/1996 | Takamine |

(Continued)

OTHER PUBLICATIONS

ISA/US, Int. Search Report and Written Opinion issued on PCT application No. US18/17361, dated May 21, 2018, 9 pages.

*Primary Examiner* — Raul J Rios Russo
(74) *Attorney, Agent, or Firm* — Cook Alex Ltd.

(57) ABSTRACT

A system for use in locating and testing a cable having a first end connected to a first connector and a second end connected to a second connector where the second connector is one of a plurality of connectors within a patch panel. The system includes a first device having a first cable certification and test circuitry which is couplable to the first connector and a second device having a second cable certification and test circuitry which is couplable to the second connector. One of the first device and the second device further includes circuitry for generating a tone signal that is to be applied to the cable and the other one of the first device and the second device further includes a probe for receiving the tone signal and for generating an output indicative of a strength of the received tone signal.

11 Claims, 2 Drawing Sheets

(51) Int. Cl.
*G01R 31/04* (2006.01)
*H04M 3/22* (2006.01)

(56) References Cited

U.S. PATENT DOCUMENTS

| | | |
|---|---|---|
| 5,703,928 A | 12/1997 | Galloway et al. |
| 5,909,113 A | 6/1999 | Clement et al. |
| 6,707,305 B2 | 3/2004 | Johnson et al. |
| 6,798,183 B2 | 9/2004 | Bohley et al. |
| 6,946,850 B2 | 9/2005 | Siglinger et al. |
| D512,333 S | 12/2005 | Blacken et al. |
| 7,026,803 B2 | 4/2006 | Kurth |
| 7,116,093 B2 | 10/2006 | Johnson et al. |
| 7,242,178 B2 | 7/2007 | Kahkoska et al. |
| 7,598,721 B2 | 10/2009 | Kahkoska et al. |
| 2003/0071634 A1 | 4/2003 | Johnson et al. |
| 2004/0113604 A1 | 6/2004 | Renken et al. |
| 2007/0127627 A1* | 6/2007 | Kern, Jr. ............... H04M 3/229 379/1.01 |
| 2009/0061678 A1* | 3/2009 | Minoo .................. H01R 29/00 439/502 |
| 2012/0290246 A1* | 11/2012 | Bhatnagar .......... G01R 31/2844 702/122 |
| 2012/0306631 A1 | 12/2012 | Hughes |
| 2013/0234725 A1 | 9/2013 | Enge |
| 2016/0356670 A1* | 12/2016 | Brillhart ............ G01M 11/3136 |
| 2016/0381123 A1* | 12/2016 | Kanne ..................... H04Q 9/00 709/224 |

* cited by examiner

SYSTEM AND METHOD FOR USING A CONNECTOR AT THE END OF A CABLE AS A CABLE LOCATING TONE SENSOR

RELATED APPLICATION DATA

This application claims the benefit of U.S. Provisional Application No. 62/458,662, filed on Feb. 14, 2017, which application is incorporated herein by reference in its entirety.

BACKGROUND

The use of tone and probe systems for tracing network and communications cables is well known in the art. By way of example, existing tone and probe systems are disclosed in U.S. Pat. Nos. 7,242,178, 5,457,441, 5,574,769, 5,577,009, 5,703,928, 5,909,113, 6,707,305, 6,798,183, 6,946,850, 7,026,803, 7,026,803, 7,116,093, 7,598,721, and D512333, each of which is incorporated herein by reference in its entirety.

As described in these references, existing systems use a tone generator that generates an electrical signal either at an audible frequency or a higher frequency and with or without some form of modulation designed to carry information. This signal emanates from a connector on the tone generator 1 as shown in FIG. 1. The signal is coupled onto a cable 4 that is to be traced via an intermediate cable 2 that is connected between the tone generator 1 and a connector 3 that is positioned at one end of the cable 4 to be tested. A hand held probe 6 is then used to find the other end of the cable 4 by attempting to receive the applied signal at one or more connections on a patch panel 5. When the tone signal is received by the probe 6, following signal processing and amplification, the received tone is presented to the operator by the probe 6 as an audible and or visual display of signal strength. The cable 4 that the user is attempting to trace can then be identified as being the cable that is terminated at the socket presenting the highest signal strength when the probe 6 is coupled to each of the multiple sockets of the patch panel 5.

Once the cable of interest is located, the next operation in the test sequence requires the tone generator 1 and the intermediate cable 2 to be disconnected and replaced with one part of a LAN tester 6A as shown in FIG. 2. The LAN tester 6A is connected via use of test adaptor and a special patch cable 9 as further shown in FIG. 2. The other part of the LAN tester 6B is then connected by a second test adaptor and another special patch cable 9 to the socket in the patch panel 5 identified in the first steps described above. In this manner, the complete circuit may now be tested by the pair of LAN Testers as required.

While such a system does work for its intended purpose, the following describes an improved system and method for using a connector at the end of a cable as a cable locating sensor.

SUMMARY

An improved system and method for locating and testing a cable having a first end connected to a first connector and a second end connected to a second connector where the second connector is one of a plurality of connectors within a patch panel is described. Generally, the system includes a first device having a first cable certification and test circuitry which is couplable to the first connector and a second device having a second cable certification and test circuitry which is couplable to the second connector. One of the first device and the second device further includes circuitry for generating a tone signal that is to be applied to the cable and the other one of the first device and the second device further includes a probe for receiving the tone signal and for generating an output indicative of a strength of the received tone signal.

A better understanding of the objects, advantages, features, properties and relationships of the subject system and method will be obtained from the following detailed description and accompanying drawings which set forth illustrative embodiments which are indicative of the various ways in which the principles of the system and method may be employed.

BRIEF DESCRIPTION OF THE DRAWINGS

For a better understanding of the invention hereinafter claimed, reference may be had to a preferred embodiment shown in the following drawings in which:

DETAILED DESCRIPTION

With reference to the figures, an improved system and method for tracing and testing network and communication cables is now described.

Figure 1:
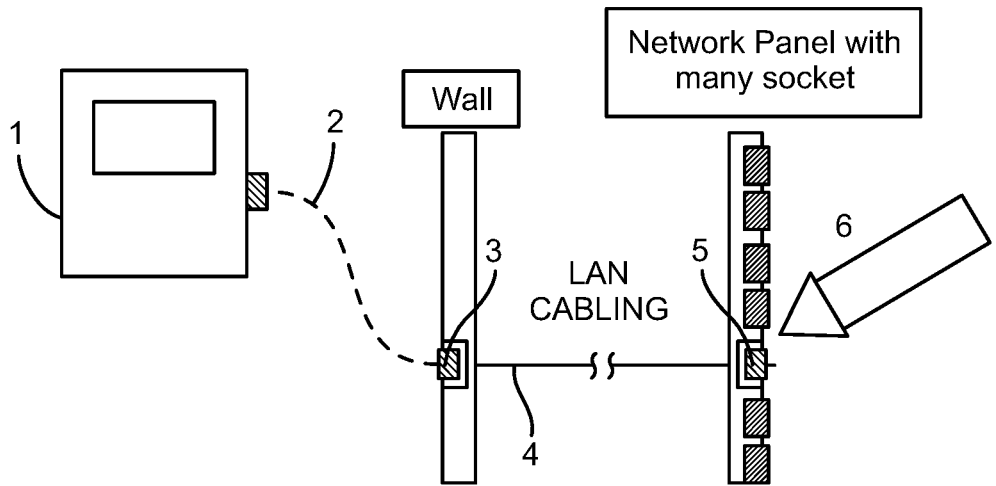
FIG. 1 illustrates a prior art system and method for using a "tone and probe" system to trace network and communications cables.
Figure 2:
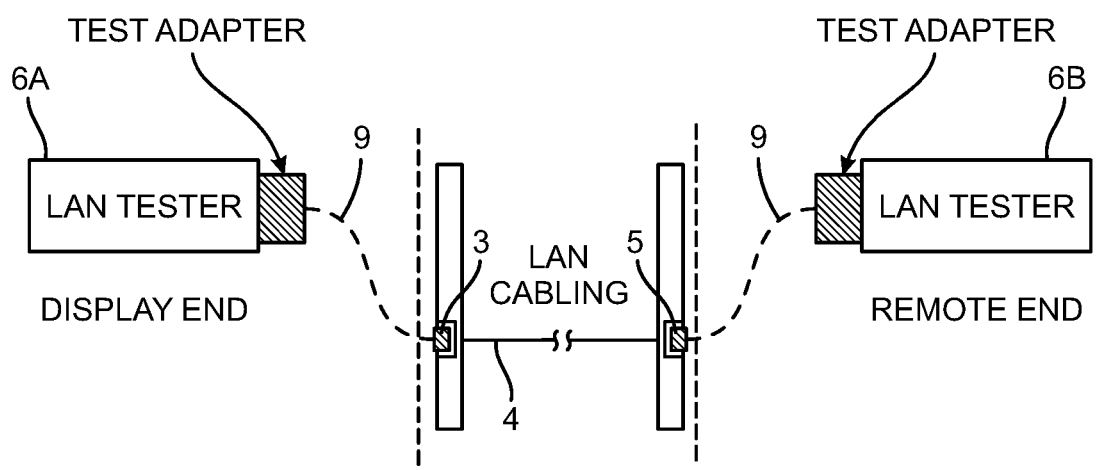
FIG. 2 illustrates a prior art system and method for using LAN testers to test a traced network or communications cable.
Figure 3:
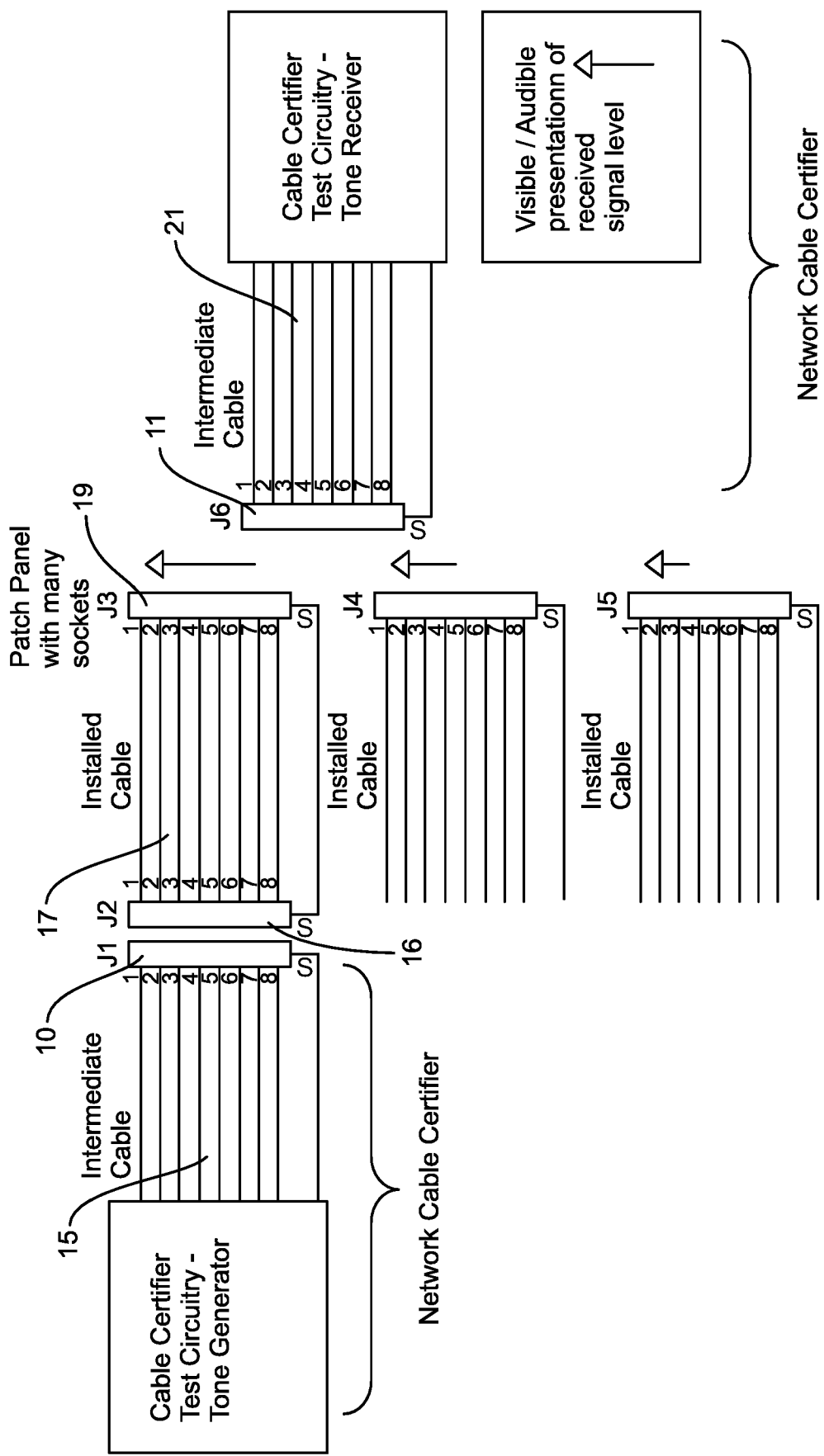
FIG. 3 illustrates the subject, improved system and method for tracing and testing network and communication cables.

Turning now to FIG. 3, it is to be appreciated that the described system and method is intended to assist an operator, who is connecting some specific test equipment (e.g. a network cable certifier) to the two ends of a cable to be tested, in further identifying the exact connectors to be used. While it continues to be necessary to identify the specific connector, e.g., socket, that terminates the cable to be tested on a panel of many connectors, rather than moving a dedicated probe across the front of these sockets, as described above in connection with prior art FIG. 1, and then replacing the tone generator at the one end of the cable with the first part of the network cable certifier equipment and then plugging in the cable to the second part of the network cable certifier, as described above in connection with prior art FIG. 2, the following proposes a system in which a tone generator is incorporated into a network cable certifier so both the tone generator and network cable certifier are connected at the same time. To this end, as further shown in FIG. 3, the connector 10 on the end of an intermediate cable 15 that is coupled to the tone generator/network cable certifier is coupled with an end of an installed cable 17, which end terminates at a connector 16. The other end of the cable 17 is typically fitted into a patch panel containing many termination connectors 19, one of which provides the termination for the cable 17. Thus, a connector 11 on the end of an intermediate cable 21 that is coupled to a network cable certifier, which also has associated therewith probe circuitry, may be placed into communication with the termination connectors 19 of the patch panel to thereby allow the cable 17 to be traced.

More particularly, once the connector 10 on the end of an intermediate cable 15 is coupled to the connector 16 as described above, the circuitry inside the right hand (as shown in FIG. 3) network cable certifier will be capable of receiving a signal (if any) from a connector 19 (where the signal is generated by the left hand tone generator/network cable certifier coupled to the cable 11) whereupon the received signal will be processed in a similar way to a normal probe as described above. For tracing the cable, an operator is intended to move the connector 11 into at least close proximity to each of the connectors 19, e.g., sockets, on the patch panel, in turn, whereupon the right hand network cable certifier will be able to indicate the received signal strength (of the connector 19 currently under test) audibly, mechanically (e.g., via vibration), and/or visibly to the operator including, possibly, by have one of these indicators attached to or combined into the connector 11. In this manner, the connector 19 exhibiting the highest received signal strength will be the one connected to the left hand network cable certifier at the other end of the cable, so both ends of the cable 17 to be tested have been identified. It is now only necessary to directly couple the connector 11 with the appropriate connector 19, e.g., insert the connector 11 into the socket at which the traced cable terminates, and testing of the installed cable can begin using the same equipment.

As will be appreciated from the foregoing, a key advantage of this described design is that it simplifies and speeds up the identification of a specific connector located with many others and so allows testing to begin more quickly.

It will also be appreciated that detailed discussion of the actual implementation of each module is not necessary for an enabling understanding of the invention. The actual implementation is well within the routine skill of a programmer and system engineer, given the disclosure herein of the system attributes, functionality, and inter-relationship of the various functional modules in the system. A person skilled in the art, applying ordinary skill can practice the present invention without undue experimentation.

While various concepts have been described in detail, it will be appreciated by those skilled in the art that various modifications and alternatives to those concepts could be developed in light of the overall teachings of the disclosure. For example, the same procedure may be performed in the reverse direction, so that the remote network cable certifier is the tone generator and the display end network cable certifier cable connector is used as a probe. In addition, the probe circuitry and/or the devices for providing an indication of received signal strength can be incorporated into the socket connector of the intermediate cable that is to be coupled to the cable certifier. As such, the particular concepts disclosed are meant to be illustrative only and not limiting as to the scope of the invention which is to be given the full breadth of the appended claims and any equivalents thereof.

What is claimed is:

1. A system for use in locating and testing a cable having a first end connected to a first connector and a second end connected to a second connector where the second connector is one of a plurality of connectors within a patch panel, comprising: a first device having a first cable certification and test circuitry which is couplable to the first connector; and a second device having a second cable certification and test circuitry which is couplable to the second connector, wherein first cable certification and test circuitry is complimentary to the second cable certification and test circuitry for certifying and testing the cable; wherein one of the first device and the second device further includes circuitry for generating a tone signal that is to be applied to the cable and the other one of the first device and the second device further includes probe circuitry for receiving the tone signal and for generating an output indicative of a strength of the received tone signal.

2. The system as recited in claim 1, wherein the other one of the first device and the second device comprises a device for audibly indicating to a user the strength of the received tone signal.

3. The system as recited in claim 1, wherein the other one of the first device and the second device comprises a device for mechanically indicating to a user the strength of the received tone signal.

4. The system as recited in claim 1, wherein the other one of the first device and the second device comprises a device for visually indicating to a user the strength of the received tone signal.

5. The system as recited in claim 1, wherein the other one of the first device and the second device is couplable to an intermediate cable and wherein the intermediate cable terminates in a cable connector that is couplable to one of the first connector and the second connector and wherein the cable connector comprises a device for audibly indicating to a user the strength of the received tone signal.

6. The system as recited in claim 1, wherein the other one of the first device and the second device is couplable to an intermediate cable and wherein the intermediate cable terminates in a cable connector that is couplable to one of the first connector and the second connector and wherein the cable connector comprises a device for mechanically indicating to a user the strength of the received tone signal.

7. The system as recited in claim 1, wherein the other one of the first device and the second device is couplable to an intermediate cable and wherein the intermediate cable terminates in a cable connector that is couplable to one of the first connector and the second connector and wherein the cable connector comprises a device for visually indicating to a user the strength of the received tone signal.

8. A system for use in locating and testing a cable having a first end connected to a first connector and a second end connected to a second connector where the second connector is one of a plurality of connectors within a patch panel, comprising: a first device having a first cable certification and test circuitry which is couplable to the first connector; a second device having a second cable certification and test circuitry which is couplable to the second connector, wherein first cable certification and test circuitry is complimentary to the second cable certification and test circuitry for certifying and testing the cable; and an intermediate cable; wherein one of the first device and the second device further includes circuitry for generating a tone signal that is to be applied to the intermediate cable, the other one of the first device and the second device is couplable to the intermediate cable, the intermediate cable terminates in a cable connector that is couplable to one of the first connector and the second connector, and the cable connector includes probe circuitry for receiving the tone signal and for generating an output indicative of a strength of the received tone signal.

9. The system as recited in claim 8, wherein the cable connector comprises a device for mechanically indicating to a user the strength of the received tone signal.

10. The system as recited in claim 8, wherein the cable connector comprises a device for visually indicating to a user the strength of the received tone signal.

11. The system as recited in claim 8, wherein the cable connector comprises a device for audibly indicating to a user the strength of the received tone signal.

* * * * *